(12) United States Patent
McGrath et al.

(10) Patent No.: US 7,272,802 B2
(45) Date of Patent: Sep. 18, 2007

(54) R-CELLS CONTAINING CDM CLAMPS

(75) Inventors: Donald T. McGrath, Fort Collins, CO (US); Scott C. Savage, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 34 days.

(21) Appl. No.: 11/126,880

(22) Filed: May 11, 2005

(65) Prior Publication Data

US 2006/0259892 A1 Nov. 16, 2006

(51) Int. Cl.
G06F 17/50 (2006.01)

(52) U.S. Cl. .......................... 716/1; 716/12

(58) Field of Classification Search ............ 716/12–17, 716/8, 1; 257/355
See application file for complete search history.

(56) References Cited

U.S. PATENT DOCUMENTS

| | | | | |
|---|---|---|---|---|
| 5,991,135 | A * | 11/1999 | Saleh ........................... | 361/56 |
| 6,063,672 | A * | 5/2000 | Miller et al. ................. | 438/275 |
| 6,078,068 | A * | 6/2000 | Tamura ........................ | 257/203 |
| 7,129,545 | B2 * | 10/2006 | Cain et al. ................... | 257/355 |
| 7,187,527 | B2 * | 3/2007 | Su et al. ....................... | 361/56 |
| 2003/0008463 | A1 * | 1/2003 | Ohnakado et al. .......... | 438/286 |
| 2004/0243949 | A1 * | 12/2004 | Wang et al. .................... | 716/4 |
| 2004/0268284 | A1 * | 12/2004 | Perez et al. ..................... | 716/11 |
| 2005/0091629 | A1 * | 4/2005 | Eisenstadt et al. ............ | 716/13 |
| 2005/0102644 | A1 * | 5/2005 | Collins et al. ................. | 716/11 |
| 2005/0152081 | A1 * | 7/2005 | Worley ......................... | 361/56 |
| 2005/0236673 | A1 * | 10/2005 | Woo et al. .................... | 257/355 |
| 2005/0270712 | A1 * | 12/2005 | Huang et al. .................. | 361/90 |
| 2006/0044718 | A1 * | 3/2006 | Su et al. ......................... | 361/56 |
| 2006/0075368 | A1 * | 4/2006 | Bakir et al. .................... | 716/10 |
| 2006/0271901 | A1 * | 11/2006 | Savage et al. ................. | 716/16 |
| 2007/0002508 | A1 * | 1/2007 | Vanysacker et al. .......... | 361/56 |
| 2007/0018287 | A1 * | 1/2007 | Coenen ....................... | 257/666 |

* cited by examiner

*Primary Examiner*—Paul Dinh
*Assistant Examiner*—Suchin Parihar
(74) *Attorney, Agent, or Firm*—Christopher P. Maiorana P.C.

(57) ABSTRACT

A method for producing a chip is disclosed. A first step of the method may involve first fabricating the chip only up to and including a first metal layer such that a core region of the chip has an array of cells, each of the cells having a plurality of transistors. A second step of the method may be to design a plurality of upper metal layers above the first metal layer in response to a custom design created after the first fabricating has started, the upper metal layers interconnecting a plurality of the cells to form an electrostatic discharge clamp at a power domain crossing. A third step may include second fabricating the chip to add the upper metal layers.

24 Claims, 4 Drawing Sheets

R-CELLS CONTAINING CDM CLAMPS

FIELD OF THE INVENTION

The present invention relates to a method of producing an integrated circuit generally and, more particularly, to a chip having R-cells that can be configured to implement charge device model (CDM) clamps.

BACKGROUND OF THE INVENTION

In platform application specific integrated circuits (ASICs), defining a section of circuitry in a power domain (i.e., low noise) is commonly problematic where the circuitry interfaces with a noisy power domain. Electrostatic discharge (ESD) issues, and in particular charge device model (CDM) ESD issues, often exist at an interface between the two power domains. A receiving circuit in the power domain can receive power spikes from a transmitting circuit in the noisy power domain. If the power spikes are sufficiently large, transistors in the receiving circuit can be permanently damaged.

A conventional approach to the CDM ESD issue is to include a dedicated clamp circuit at the power domain crossings to protect the receiver circuit. However, positioning of the dedicated clamps cannot be determined until the full chip design is nearly complete and the power domains are reasonably defined. As such, fabrication of silicon is stalled until the final design is close to completion.

SUMMARY OF THE INVENTION

The present invention concerns a method for producing a chip. A first step of the method may involve first fabricating the chip only up to and including a first metal layer such that a core region of the chip has an array of cells, each of the cells having a plurality of transistors. A second step of the method may be to design a plurality of upper metal layers above the first metal layer in response to a custom design created after the first fabricating has started, the upper metal layers interconnecting a plurality of the cells to form an electrostatic discharge clamp at a power domain crossings. A third step may include second fabricating the chip to add the upper metal layers.

The objects, features and advantages of the present invention include providing a chip having R-cells that can be configured to implement CDM clamps that may (i) protect against transients at power domain crossing, (ii) be relocatable within an R-cell fabric and/or (iii) enable low-jitter designs for phase locked loop modules, delay locked loop modules, phase interpolator modules and/or mixed-signal (e.g., analog signals and digital signals) modules in a core region of a chip containing digital modules.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
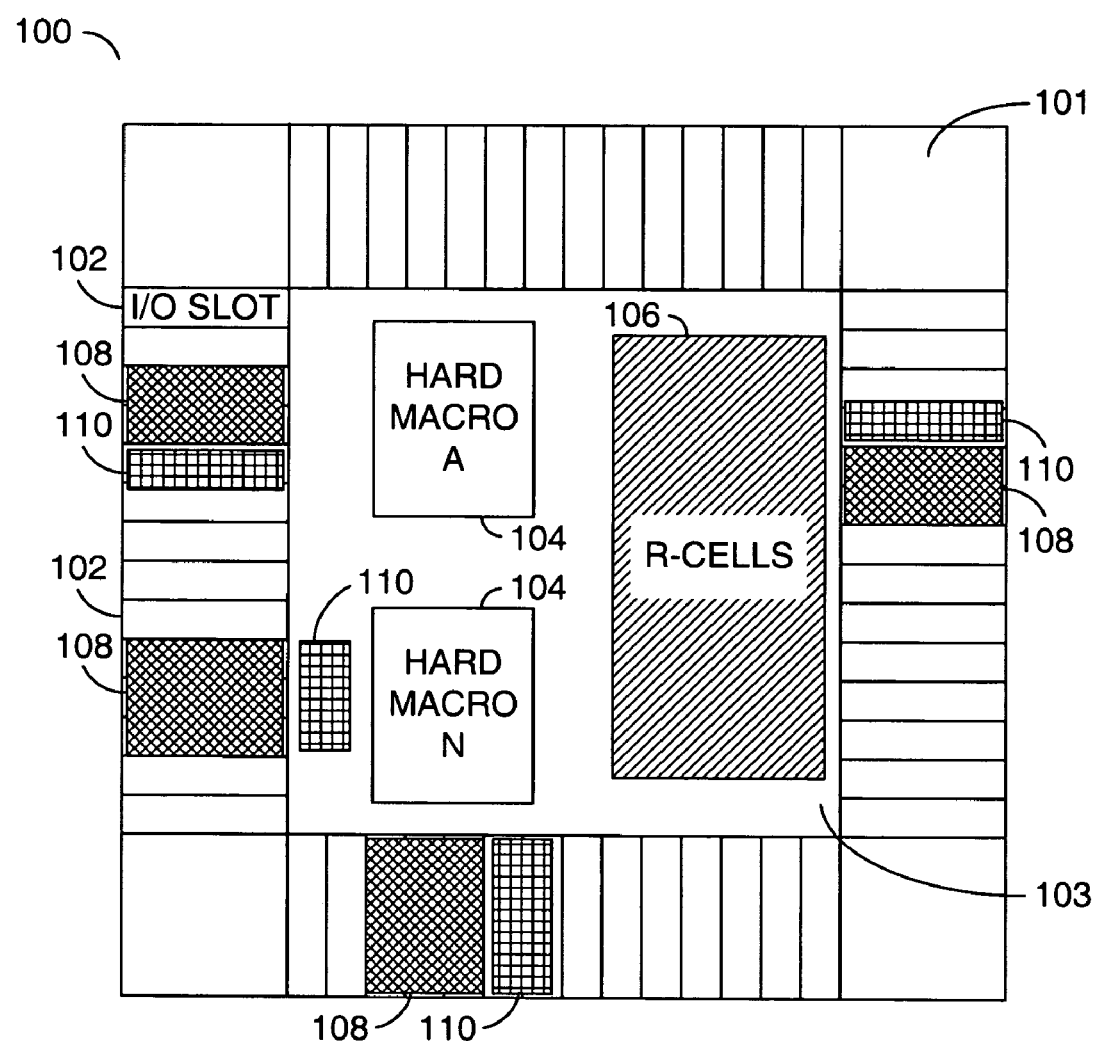
FIG. 1 is a block diagram illustrating a platform application specific integrated circuit (ASIC) in accordance with a preferred embodiment of the present invention.

Referring to FIG. 1, a block diagram of a programmable platform device (or die, or chip, or slice) 100 is shown in accordance with one or more preferred embodiments of the present invention. The slice 100 may be implemented, in one example, as a partially manufactured semiconductor device (e.g., a platform application specific integrated circuit (platform ASIC)) in which all of the silicon layers (or base layers) have been fabricated (e.g., a first processing or pre-inventory phase), but where customization of the slice 100 may be performed later (e.g., a second processing or completed phase) via one or more upper metal layers.

In one example, a number of slices 100 may be fabricated having different varieties and/or numbers of intellectual property (IP) blocks, diffused memories, etc. By fabricating a variety of slices with a variety of IP blocks and diffused memories, a wide variety of applications may be supported. For example, a particular slice 100 may be selected for customization at a later time because the particular IP blocks implemented are suitable for a customized application. By deferring customization of the slice 100, a manufacturer may have flexibility to keep an inventory of mostly complete slices 100 that may be customized for a variety of applications. The IP blocks may comprise, for example, hard IP, soft IP and/or firm IP. Hard IP may be diffused at optimal locations within a slice using cell-based elements for maximum performance and density (e.g., embedded processors, transceivers, etc.). Soft IP may be incorporated into a slice as a function block. Soft IP may be implemented similarly to other blocks in a design (e.g., with specific timing criteria to ensure functionality). Soft IP may be implemented, in one example, as Register Transfer Language (RTL) code. Firm IP generally allows fully routed and characterized high-performance blocks to be implemented in a slice design.

A physical layout of the slice 100 generally comprises a first region 101 and a second region 103. The first region 101 may be defined around a periphery (or outer edge) of the slice 100 where most to all of the input/output (I/O) circuits may be located. As such, the first region 101 may be referred to as an input/output region. The second region 103 may be located inside the input/output region 101. The second region 103 generally contains most or all of the standard library and custom circuitry that makes the slice 100 unique. As such, the second region 103 may be referred to as a core region.

The slice 100 may comprise a number of pre-diffused regions. In one example, the slice 100 may comprise a plurality of regions 102, a number of regions 104, and one or more regions 106. The plurality of regions 102 may be located around the periphery (or outer edge) of the slice 100. The regions 102 may be implemented as configurable I/O slots (or ConfigIOs). For example, each of the regions 102 may be configured to couple the core region 103 of the slice 100 to an I/O pin. The regions 104 may be implemented as one or more hard IP blocks (or hard macros). The regions 106 may be implemented as one or more customizable regions. In one example, the customizable regions 106 may comprise an R-cell transistor fabric (or array, or matrix). In another example, the customizable regions 106 may be implemented as a gate array region. The regions 102 may be distributed around the input/output region 101 of the slice 100. The regions 104 and 106 may be distributed within the core region 103 of the slice 100.

In one example, the regions 104 may be implemented similarly to an ASIC design. In general, the regions 104 may be configured to provide a number of functions on (in) the slice 100. For example, the regions 104 may comprise phase locked loop (PLL) blocks (or modules), instances of processor blocks (or modules), input/output physical level (PHY) macro blocks (or modules) and/or any other type of IP block (or module) appropriate to meeting the design criteria of a particular implementation. Soft IP blocks (or modules) and firm IP blocks (or modules) may be implemented in the customizable region 106.

The customizable region 106 may be configured by a customer (e.g., by a custom design of one or more metal layers), in one example, as logic and/or memory. For example, the region 106 may be implemented as sea-of-gate arrays. In one example, the region 106 may be implemented as an R-cell transistor fabric comprising a number of R-cells. The term R-cell generally refers to an area of silicon designed (or diffused) to contain multiple transistors that have not yet been personalized (or configured) with metal layers. Wire (or trace) layers may be added for interconnecting the R-cells to make particular transistors, logic gates, soft IP blocks, firm IP blocks, electrostatic discharge clamps and/or storage elements. For example, the R-cells in the region 106 may be customized to build non-diffused memories or other circuits for a particular application. A region 106 filled with thousands of R-cells may be referred to as an R-cell fabric 106.

An R-cell generally comprises multiple diffusions, a gate layer and a metal layer for forming the parts of n-type and p-type transistors, and the contact points where upper metal layers may be attached in subsequent manufacturing steps (e.g., to power, ground, inputs and outputs). For example, each R-cell may be implemented as a five-transistor cell, which includes two n-channel metal oxide semiconductor field effect transistors (NMOS devices), two p-channel MOSFET transistors (PMOS devices) and a small PMOS device. In general, the R-cells may be, in one example, building blocks for logic, mixed-signal and/or storage elements. The R-cells may be diffused in a regular pattern throughout a slice. For example, one way of designing a chip that performs logic and storage functions may be to lay down numerous R-cells row after row, column after column to form a matrix or array of cells. A large area of the slice 100 may be devoted to nothing but R-cells. The R-cells may be personalized (or configured) in subsequent production steps (e.g., by depositing and patterning upper metal layers) to provide particular logic functions. The logic functions may be further wired together (e.g., a gate array design).

Prior to customization, the regions 102 and 106 may comprise generic pre-diffused regions that may provide a rich set of devices (e.g., transistors, resistors, capacitors, etc.). A number of different generic pre-diffused regions may be implemented (e.g., CONFIGIO1, CONFIGIO2, etc.). In one example, a number of types of transistors (e.g., N and P, TO, ATO, HP, etc.) may be implemented in each of the regions 102. Some example types and numbers of devices that may be implemented in the regions 102 may be summarized in the following TABLE 1:

TABLE 1

| CONFIGIO2 | | CONFIGIO1 | |
|---|---|---|---|
| Device Type | Number of R-cells | Device Type | Number of R-cells |
| pm_hp | 401 | pm_hp | 178 |
| pm_ato | 2048 | pm_ato | 470 |
| nm_ato | 129 | nm_to | 66 |
| nm_aton | 84 | nm_esd | 12 |
| nm_esd | 16 | resistors | 21 |
| nm_hp | 372 | | |
| nm_to | 1798 | | |
| resistors | 84 | | |

However, it will be understood by those skilled in the art that other types and/or numbers of devices may be implemented without departing from the spirit and scope of the present invention.

Some examples of mixed-signal functions that may be fabricated in the R-cell fabric 106 may be summarized in the following TABLE 2:

TABLE 2

| Circuit | # of Slots | Applications | Function |
|---|---|---|---|
| PLL/DLL (500 MHZ range or less | 5-6 | Clock multipliers, clock-data deskew | Clock generation |
| Temperature Sensor (+/− 10-15 degree C. accuracy) | 2-3 | Cabinet design, package selection verification, system testing, reliability verification | Provides digital output proportional to die temperature |
| Voltage regulator | 1-2 | Any product that employs dual voltages | Generates 1.2 V, 1.8 V, or 2.5 V supply from 2.5 V or 3.3 V supply. May use external pass device |
| Power On Reset (POR) | 1-2 | May be employed in any electronic product or system | Signals when I/O or core voltages are at valid levels |
| 8-10 bit, 1 Msps ADC | 3-5 | Tape/disc drive servos, MP3 players, digital cameras, wireless devices, fish finders, featurized phones, circuit breakers, process controllers | Sensor interface (temperature, touchpanel, battery monitor, vibration, humidity, position, other), RSSI, control systems |
| 12-14 bit, 20 Ksps Sigma-delta ADC | 1-3 | Circuit breakers, power meters, instrumentation, voice encoders, motor diagnostics, medical devices, process controllers | Sensor interface (temperature, touchpanel, battery monitor, vibration, humidity, position, other) |
| 8-bit, 10 Msps DAC | 2-3 | Motion control, process control, Tape/disc servos, digital trimming | Actuation and control |
| 32 KHz-50 MHz Crystal Oscillator | 2 | Any application where a system clock is not always available: MP3 players, digital cameras, wireless devices, fish finders, featurized phones, circuit breakers | Generates a clock at a specified frequency set by the crystal |

TABLE 2-continued

| Circuit | # of Slots | Applications | Function |
|---|---|---|---|
| Filter (SC, CT) | 1-5 | Tape read-channels, voice encoders, instrumentation, circuit breakers | Conditions as analog signals |

However, other building blocks (or circuits) may be implemented accordingly to accomplish custom analog functions. For example, other building blocks may include, but are not limited to, operational amplifiers, comparators, analog multiplexers, analog switches, voltage/current reference. The R-cell fabric 106 may also be used to implement sub-functions (e.g., the circuitry 110) of the functions 108 (e.g., switched capacitor filters, gm/C filters, data converters, etc.).

The devices implemented in the slice 100 may be programmed by defining metal mask sets. In one example, metal-insulator-metal capacitors (e.g., approximately one picofarad (pF) per slot) may be formed in the regions 102 and/or 106. In one example, more than one of the regions 102 may be combined (e.g., coupled together via routing) to implement more complex functions. For example, metal mask sets may be placed over two or more of the generic pre-diffused regions 102 to form a relocatable multi-slot function 108. The relocatable function 108 may be described as a relocatable function. The term "relocatable" is used as a general term to indicate that the function may be located (or configured) in a number of locations around the slice 100. While the final result would be that the function 108 would be located in different locations, different pre-diffused areas may be used to implement the function 108 in the different locations. Also, one or more of the functions 108 may be implemented throughout the plurality of regions 102 and/or 106. The functions 108 may be configured to provide analog functions, digital functions or mixed-signal functions using metal programmability.

The functions 108 may be enhanced by additional circuitry 110 defined by the customer. The additional circuitry 110 may be constructed without any special diffused circuitry, special process options and/or additional wafer cost. The circuitry 110 may be located on any I/O slot 102 boundary within the input/output region 101 and/or in the R-cell fabric 106 within the core region 103.

Figure 2:
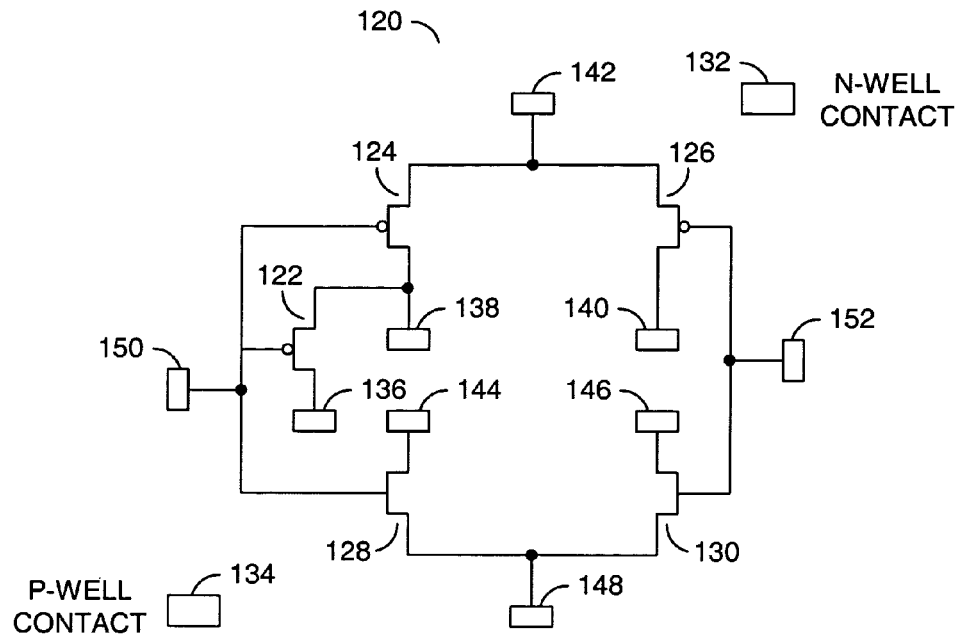
FIG. 2 is a schematic of an example implementation of an R-cell.

Referring to FIG. 2, a schematic of an example implementation of an R-cell 120 is shown in accordance with a preferred embodiment of the present invention. An R-cell 120 generally comprises a transistor 122, a transistor 124, a transistor 126, a transistor 128, a transistor 130, an n-well contact 132, a p-well contact 134, a transistor contact 136, a transistor contact 138, a transistor contact 140, a transistor contact 142, a transistor contact 144, a transistor contact 146, a transistor contact 148, a gate contact 150 and a gate contact 152.

The transistor 122 may be implemented as a p-channel MOSFET. A gate of the transistor 122 may be connected to the gate contact 150. A first node (e.g., source or drain) of the transistor 122 may be connected to the transistor contact 136. A second node (e.g., drain or source) of the transistor 122 may be connected to the transistor contact 138. In one embodiment, a channel width of the transistor 122 may be approximately 0.3 micrometers (um). A channel length of the transistor 122 may be approximately 0.115 um.

The transistor 124 may be implemented as a p-channel MOSFET. A gate of the transistor 124 may be connected to the gate contact 150. A first node (e.g., source or drain) of the transistor 124 may be connected to the transistor contact 138. A second node (e.g., drain or source) of the transistor 124 may be connected to the transistor contact 142. In one embodiment, a channel width of the transistor 124 may be approximately 1.59 um. A channel length of the transistor 124 may be approximately 0.115 um.

The transistor 126 may be implemented as a p-channel MOSFET. A gate of the transistor 126 may be connected to the gate contact 152. A first node (e.g., source or drain) of the transistor 126 may be connected to the transistor contact 140. A second node (e.g., drain or source) of the transistor 126 may be connected to the transistor contact 142. In one embodiment, a channel width of the transistor 126 may be approximately 1.59 um. A channel length of the transistor 126 may be approximately 0.115 um.

The transistor 128 may be implemented as an n-channel MOSFET. A gate of the transistor 128 may be connected to the gate contact 150. A first node (e.g., source or drain) of the transistor 128 may be connected to the transistor contact 144. A second node (e.g., drain or source) of the transistor 128 may be connected to the transistor contact 148. In one embodiment, a channel width of the transistor 128 may be approximately 0.88 um. A channel length of the transistor 128 may be approximately 0.115 um.

The transistor 130 may be implemented as an n-channel MOSFET. A gate of the transistor 130 may be connected to the gate contact 152. A first node (e.g., source or drain) of the transistor 130 may be connected to the transistor contact 148. A second node (e.g., drain or source) of the transistor 130 may be connected to the transistor contact 146. In one embodiment, a channel width of the transistor 130 may be approximately 1.235 um. A channel length of the transistor 130 may be approximately 0.115 um.

The R-cells 120 generally include all fabrication layers between well diffusions and a first metal layer, inclusively. When initially fabricated, each R-cell is isolated from neighboring R-cells. Therefore, any particular R-cell may be later connected through one or more upper metal layers to other circuitry (e.g., other R-cells 120, I/O slots 102, hard macros 104, firm macros, soft macros, modules 108 and/or modules 110) within one power domain or crossing between two or more power domains.

The R-cells 120 may provide a mechanism for solving the CDM EDS issue. One or more R-cells 120 at a boundary between power domains may be customized with a design in the upper metal layers to form a CDM clamp block (or module). The CDM clamp generally provides suppression of voltage spikes and/or power spikes crossing the power domain boundary in a particular direction. Each CDM clamp generally comprises a resistive element and a normally-off (e.g., grounded gate NMOS) transistor. The resistive element may spread the power of the spikes in time. The normally-off transistor may provide a path to ground to dissipate the voltage and/or power of the spike.

Figure 3:
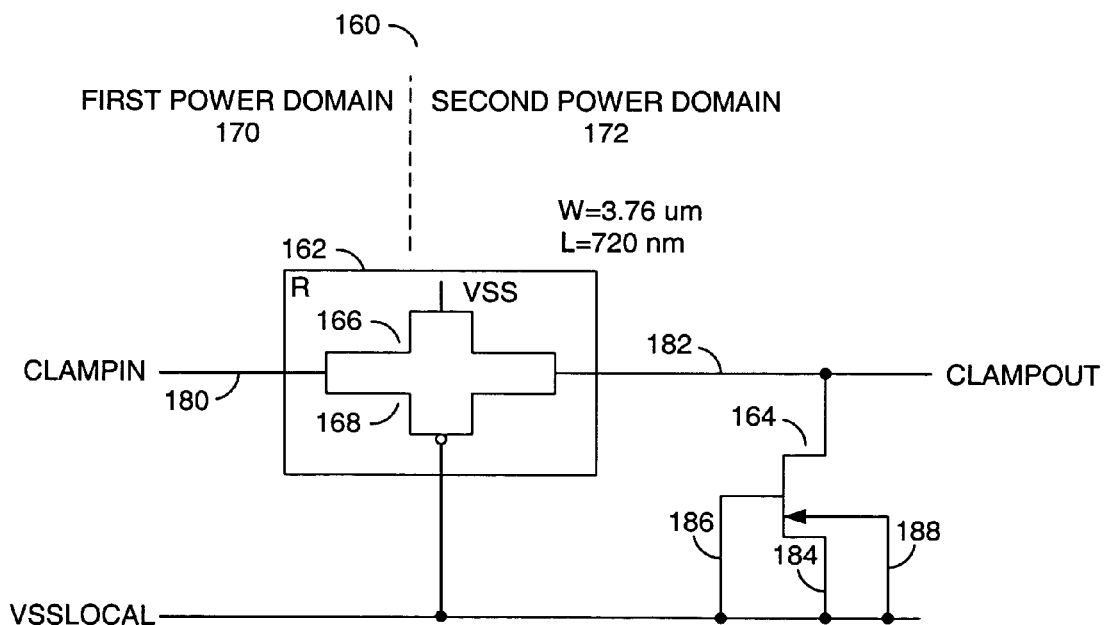
FIG. 3 is a schematic of an example implementation of a CDM clamp.

Referring to FIG. 3, a schematic of an example implementation of a CDM clamp 160 is shown. The CDM clamp 160 generally comprises a pass gate 162 and a transistor 164. The pass gate 162 generally comprises one or more n-channel transistors 166 (only one shown) and one or more p-channel transistors 168 (only one shown). A gate of the transistor 166 may be connected to a high power supply to bias the transistor 166 in an on state. A gate of the transistor 168 may be connected to a low power supply to bias the transistor 168 in the on state.

The pass gate 162 generally behaves as a resistive element (e.g., R). A first end of the pass gate 162 may receive a signal (e.g., CLAMPIN) on a trace 180 generated in a first power domain 170. A second end of the pass gate 162 may present a signal (e.g., CLAMPOUT) on a trace 182 into a second power domain 172.

The transistor 164 may be implemented as an n-channel transistor. A drain of the transistor 164 may be connected to the second end of the pass gate 162 via the trace 182. A source of the transistor 164 may be connected to a local ground (e.g., VSSLOCAL) through a trace 184. A gate of the transistor 164 may be connected to the local ground VSSLOCAL via a trace 186. A channel well (e.g., bulk) of the transistor 164 may also be connected to the local ground VSSLOCAL through a trace 188.

The pass gate 162 and the transistor 164 may be implemented with transistors from one or more R-cells 120 interconnected to act as a clamp device. In one embodiment, the transistors 166 and 168 may each be implemented as eighteen transistors (e.g., three parallel sets of six serial transistors each). The transistor 164 may be implemented as ten transistors operating in parallel.

The transistor 164 may be operational to route a spike received in the signal CLAMPIN to the local ground VSSLOCAL. A negative-voltage spike may forward bias the gate-to-drain voltage causing the channel to conduct the spike to ground. A positive-voltage spike may cause a breakdown of the drain-to-well junction causing the channel to conduct the spike to ground. Other designs of the CDM clamp block 160 may be implemented from the R-cells 120 to meet the design criteria of a particular application.

The traces 180-188 may be fabricated in one or more upper metal layers above the first metal layer used by the R-cells 120. The upper metal layers may include a second metal layer, a third metal layer, a fourth metal layer and a fifth metal layer. A greater or smaller number of upper metals layers may be fabricated to meet the design criteria of the customer.

Figure 4:
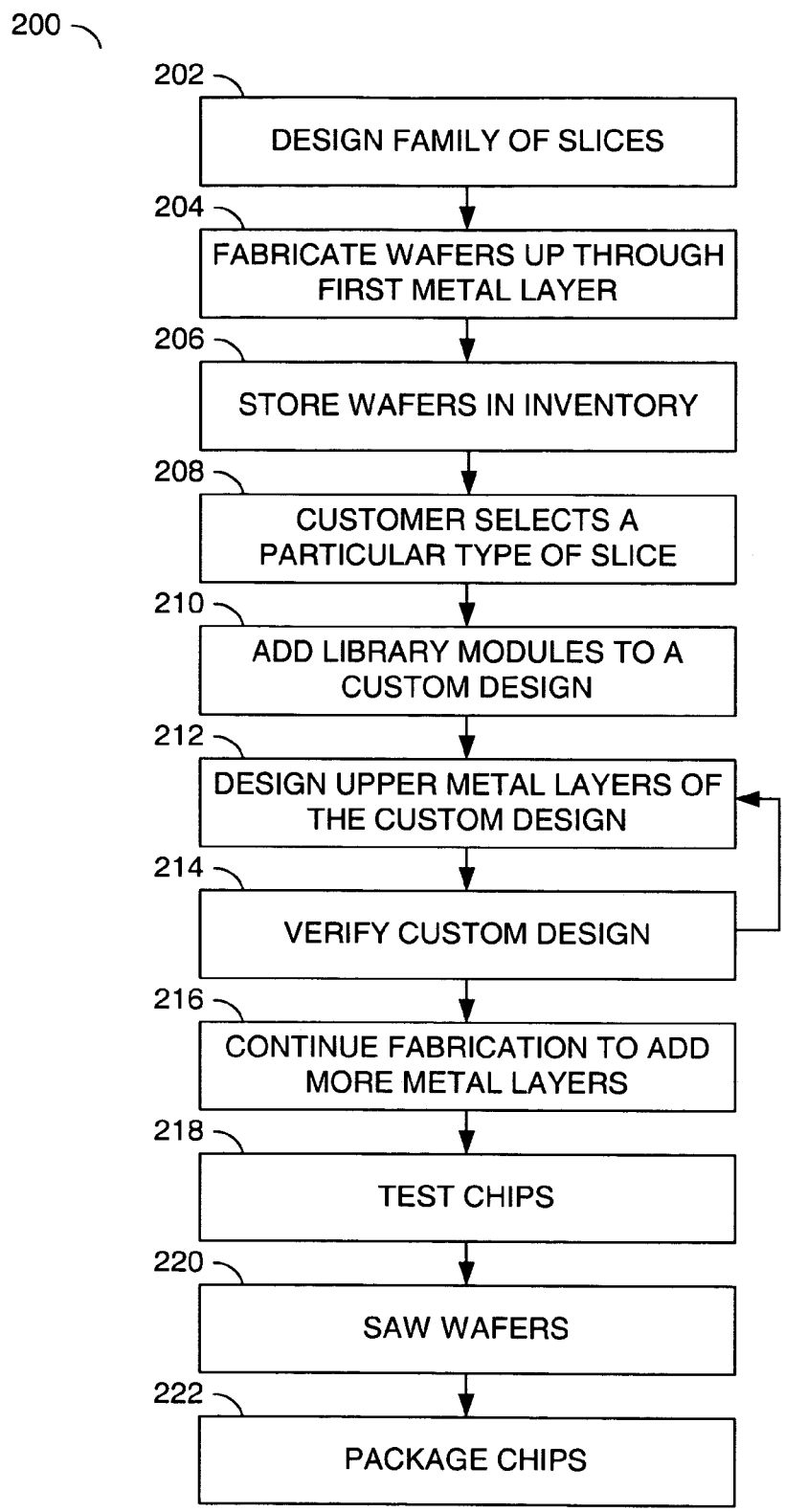
FIG. 4 is a flow diagram of an example method for designing and providing a chip.

Referring to FIG. 4, a flow diagram of an example method 200 for designing and providing a chip is shown. The method 200 generally comprises a step (or block) 202, a step (or block) 204, a step (or block) 206, a step (or block) 208, a step (or block) 210, a step (or block) 212, a step (or block) 214, a step (or block) 216, a step (or block) 218, a step (or block) 220 and a step (or block) 222.

The method (or process) 200 may start with the design of a family of slices (e.g., including slice 100) in step 202. Each different slice design in the family may include a different assortment of fixed memory blocks, memory physical interface blocks, communication blocks, clock generation blocks, customizable input/output blocks, fixed design input/output blocks, and/or processor blocks. An initial fabrication may be performed in step 204 to create wafers in each of the families. The wafers may then be placed in storage in step 206 until needed to fill a customer order. Storage may last from days to months, or even longer.

After the wafers have been fabricated, or while the wafers are being fabricated, a customer may begin developing a custom design by selecting one of the members from the slice family as a starting point in step 208. Using the circuitry provided by the selected slice member, the customer may add standard library blocks to the selected slice to increase the functionality in step 210. The standard library blocks may be hard IP, firm IP and/or soft IP that utilize the R-cells 120 and any other undefined elements in the slice to implement a standard function (e.g., processor, PLL, memory, etc.) One or more variations of a CDM clamp block (e.g., clamp 160) may be available in the library as a relocatable block. The CDM clamps may be positioned in the core region 103 as appropriate to provide transient suppression between power domains.

The customer may continue the development by designing interconnecting traces (or wires) for signals and power in one or more metal (or conductive) layers, starting from the second metal layer and up, in step 212. The design of the upper metal layers may provide connections among the predefined circuitry in the particular slice and the standard library cells added to the slice. The design of the upper metal layers may also be used to create custom circuitry using the R-cells 120. For example, a function unavailable in the library of standard blocks may be synthesized using the transistors in the R-cells 120.

Figure 5:
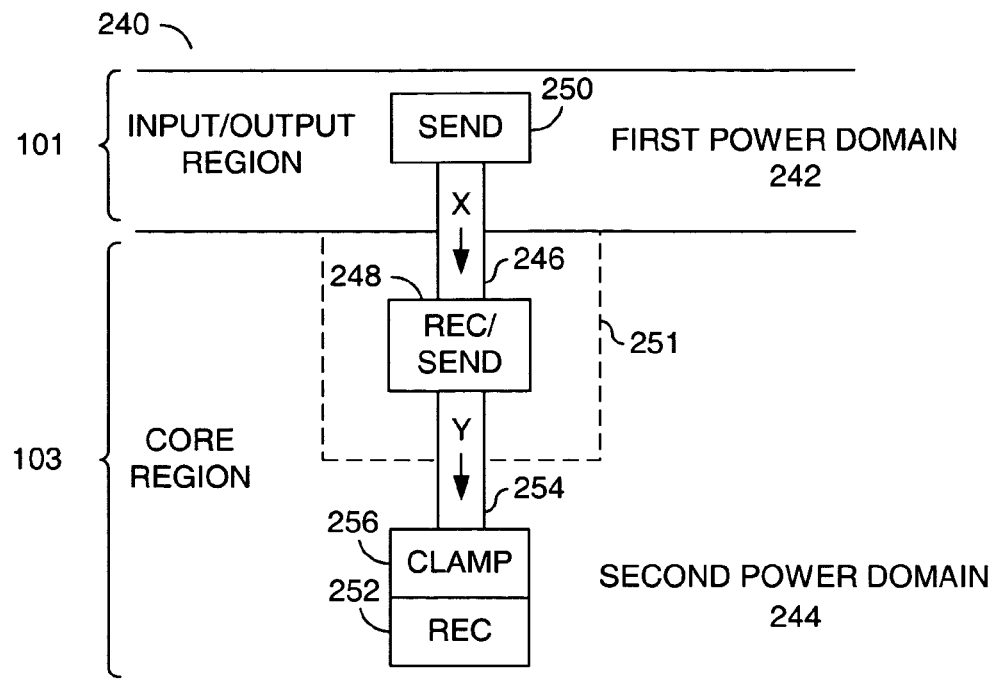
FIG. 5 is a block diagram of a first example of multiple power domains.

Referring to FIG. 5, a block diagram of a first example of multiple power domains is shown. The custom circuitry and custom traces designed into the upper metal layers may result in signals crossing power domain boundaries and/or effectively moving the power domain boundaries across region boundaries. For example, a basic slice 240 may have two predetermined power domains, one power domain 242 for the input/output region 101 and another power domain 244 for the core region 103. By adding a trace (or wire) 246 in a customizable metal layer, a signal (e.g., X) may flow from the input/output region 101 into the core region 103. If a receiving circuit (or module) 248 in the core region 103 that receiving the signal X also operates from the same power as a sending circuit (or module) 250 in the input/output region 101, then the first power domain 242 may be effectively extended (e.g., area 251) into the core region 103.

The custom design may include the circuit 248 (now in the first power domain 242) presenting a signal (e.g., Y) to another receiving circuit 252 via a trace 254. If the receiving circuit 252 is in the second power domain 244, the signal Y may cross the first-to-second power domain boundary. Therefore, the customer may design a clamp circuit 256 at the power domain edge to protect the receiving circuit 252.

Figure 6:
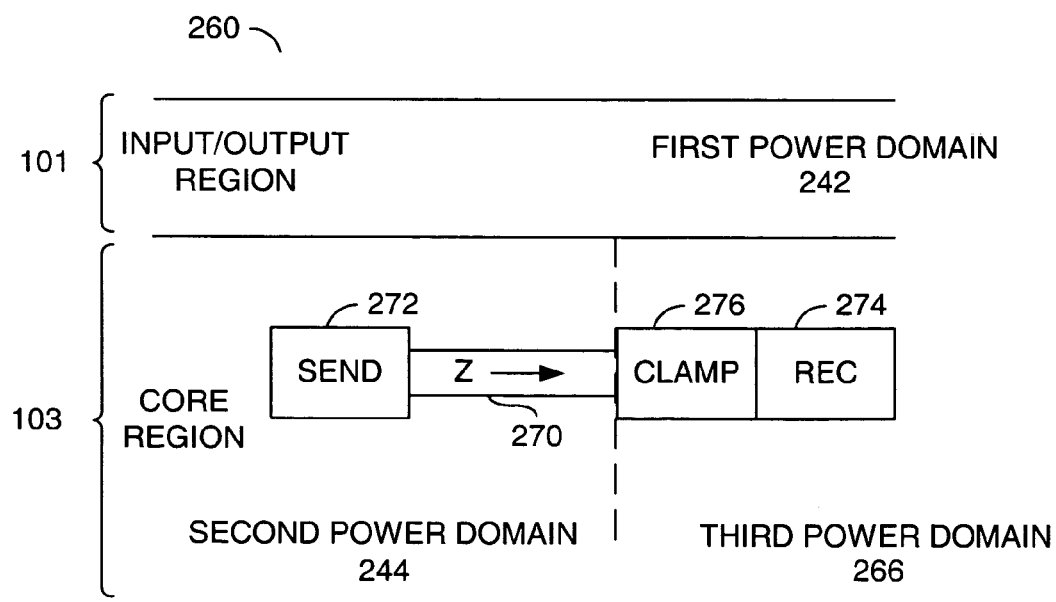
FIG. 6 is a block diagram of a second example of multiple power domains.

Referring to FIG. 6, a block diagram of a second example of multiple power domains is shown. Power domain boundaries may be created internal to a region (e.g., the core region 103) due to the custom design. For example, a slice 260 may have the first power domain 242 in the input/output region 101 and the second power domain 244 in the core region 103. However, the custom design may result in the creation of a third power domain 266 in the core region 103.

A trace 270 in an upper metal layer may connect a sending circuit (or module) 272 in the second power domain 244 to a receiving circuit (or module) 274 in the third power domain 266. A signal (e.g., Z) flowing through the trace 270 may thus cross a second-to-third power domain boundary. A clamp 276 may be designed between the sending circuit 272 and the receiving circuit 274 to protect the receiving circuit 274.

Returning to FIG. 4, after the custom design has been completed, a verification may be performed in step 214. A variety of commercial tools are generally available to perform verification checks. Any problems identified by the verification may be corrected in the design by returning to the step 212.

Once the verification has been completed, wafers of the selected slice type may be removed from the inventory for additional processing. In step 216, additional metal layers, insulating layers, top coats and the like may be fabricated on the wafers. Limited functional testing of each chip may then be performed in step 218. After testing, the wafers are generally sawed in step 220 to separate the individual chips.

Good chips may be packaged in step 222 to create a finished product. The packaged chips may be provided to the customer for additional testing and evaluation.

An advantage of the method 200 may be an ability to place and route CDM clamps anywhere in the core region 103 at any time during the custom design phase since the CDM clamps may be formed from the pre-existing R-cells. Therefore, the customer does not have to pay for designing unique layers from the first metal layer downward to create a fully custom CDM clamp. Furthermore, the creation of the CDM clamps from the R-cells does not constrain the initial fabrication phase for the wafers. The CDM clamps do not force any unique features in the diffusions, polysilicon layer, gate oxides, field oxides, vias and/or the first metal layer. Therefore, the initial fabrication phase may take place before or while the custom design is being developed and the positions of the CDM clamps may be uncertain, resulting in a short time between the end of design and completion of prototype parts.

The function performed by the flow diagram of FIG. 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMS, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for producing a chip, comprising the steps of:
   (A) first fabricating said chip only up to and including a first metal layer such that a core region of said chip has an array of cells, each of said cells having a plurality of transistors;
   (B) designing a plurality of upper metal layers above said first metal layer in response to a custom design created after said first fabricating has started, said upper metal layers interconnecting a plurality of said cells to form an electrostatic discharge clamp at a power domain crossing; and
   (C) second fabricating said chip to add said upper metal layers, wherein at least one of said upper metal layers is configured to interconnect a plurality of said transistors in said core region to form a receiving circuit that is protected by said electrostatic discharge clamp at the power domain crossing.

2. The method according to claim 1, wherein step (B) comprises the sub-step of:
   designing said upper metal layers to extend a first power domain from an input/output region at a periphery of said chip to a subset: of said cells in said core region.

3. The method according to claim 2, wherein stop (B) further comprises the sub-step of:
   designing said upper metal layers to interconnect said subset of said cells in said first power domain to said electrostatic discharge clamp in a second power domain within said core region.

4. The method according to claim 1, wherein Step (B) comprises the sub-step of:
   designing said upper metal layers to form at least two power domains within said core regions.

5. The method according to claim 4, wherein step (B) further comprises the sub-step of:
   designing said upper metal layers to interconnect said at least two power domains with said electrostatic discharge clamp at said power domain crossing.

6. The method according to claim 5, wherein step (B) comprises the sub-step of:
   designing said upper metal layers such that said electrostatic discharge clamp protects a module in said second power domain receiving a signal generated in said first power domain from spikes in said signal.

7. The method according to claim 1, wherein each of said cells comprise five of said transistors.

8. The method according to claim 7, wherein each of said cells further comprise two well contacts.

9. The method according to claim 1, further comprising the step of:
   storing said chip in an inventory between said first fabrication and said second fabrication.

10. A method for designing a chip, comprising the steps of:
    (A) selecting a particular chip design from a plurality of chip designs having (i) an array of cells in a core region and (ii) an input/output region around a periphery, each of said cells defining a plurality of transistors, said particular chip having an existing design up to and including a first metal layer;
    (B) adding a plurality of modules from a library to said particular chip design, each of said modules defining a plurality of upper metal layers above said first metal layer that interconnect some of said cells to implement a respective function; and
    (C) designing a plurality of traces in said upper metal layers interconnecting a plurality of said cells to form an electrostatic discharge clamp at a power domain crossing within said chip, wherein at least one of said upper metal layers is configured to interconnect a plurality of said transistors in said core region to form a receiving circuit that is protected by said electrostatic discharge clamp at the power domain crossing.

11. The method according to claim 10, wherein step (C) comprises the sub-step of:
    designing said upper metal layers to extend a first power domain from said input/output region of said chip to a subset of said cells in said core region of said chip.

12. The method according to claim 11, wherein step (C) further comprises the sub-step of:
    designing said upper metal layers to interconnect said subset of said cells in said first power domain to said electrostatic discharge clamp in a second power domain within said core region.

13. The method according to claim 10, wherein step (C) comprises the sub-step of:
   designing said upper metal layers to form at least two power domains within said core region of said chip.

14. The method according to claim 13, wherein stop (C) further comprises the sub-step of:
   designing said upper metal layers to interconnect said at least two power domains with said electrostatic discharge clamp at said power domain crossing.

15. The method according to claim 14, wherein stop (C) comprises the sub-step of:
   designing said upper metal layers such that said electrostatic discharge clamp protects a module in said second power domain receiving a signal generated in said first power domain from spikes in said signal.

16. A method for designing a chip, comprising the steps of:
   (A) selecting a particular chip design from a plurality of chip designs having (i) an array of cells in a core region and (ii.) an input/output region around a periphery, each of said cells defining a plurality of transistors, said particular chip having an existing design up to and including a first metal layer;
   (B) adding a plurality of modules from a library to said particular chip design, each of said modules defining a plurality of upper metal layers above said first metal layer that interconnect some of said cells to implement a respective function; and
   (C) designing a plurality, of traces in said upper metal layers interconnecting a plurality of said cells to form an electrostatic discharge clamp at a power domain crossing within said chip, wherein each of said cells comprise (i) five of said transistors, (ii) two well contacts and (ii) eleven pads in said first metal layer connected to each node of said transistors and each of said well contacts.

17. A chip comprising:
   an input/output region having a first power domain; and
   a core region having a second power domain, said core region including an array of cells each having (a) a plurality of transistors and (b) an identical design in a plurality of layers up to and including a first metal layer, wherein (A) at least, one upper metal layer above said first metal layer is configured to (i) extend said first power domain to a subset of said cells in said core region and (ii) interconnect a first plurality of said transistors in said core region to form a first electrostatic discharge clamp at a first power domain crossing between said subset of said cells and said second power domain and (B) each of said cells comprise (i) five of said transistors, (ii) two well contacts and (iii) eleven pads in said first metal layer connected to each node of said transistors and each of said well contacts.

18. A method for producing a chip, comprising the steps of:
   (A) first fabricating said chip only up to and including a first metal layer such that a core region of said chip has an array of cells, each of said cells having a plurality of transistor;
   (B) designing p plurality of upper metal layers above said first metal layer in response to a custom design created after said first fabricating has started, said upper metal layers interconnecting a plurality of said cells to form an electrostatic discharge clamp at a power domain crossing; and
   (C) second fabricating said chip to add said upper metal layers, wherein each of said cells comprise (i) five of said transistors, (ii) two well contacts and (iii) eleven pads in said first metal layer connected to each node of said transistors and each of said well contacts.

19. A chip comprising:
   an input/output region having a first power domain; and
   a core region having a second power domain, said core region including an array of cells each having (a) a plurality of transistors and (b) an identical design in a plurality of layers up to and including a first metal layer, wherein (A) at least one upper metal layer above said first metal layer is configured to (i) extend said first power domain to a subset of said cells in said core region and (ii) interconnect a first plurality of said transistors in said core region to form a first electrostatic discharge clamp at a first power domain crossing between said subset of said cells and said second power domain, wherein said at least one upper metal layer is further configured to interconnect a second plurality of said transistors in said core region to form a receiving circuit that is protected by said first electrostatic discharge clamp at the first power domain crossing.

20. The chip according to claim 19, wherein said upper metal layers are further configured to interconnect a third plurality of said transistors to form a second electrostatic discharge clamp at a second power domain crossing between said second power domain and a third power domain in said core region.

21. The chip according to claim 19, wherein said first electrostatic discharge clamp comprises:
   a resistive element connecting said first power domain to said second power domain; and
   at least one of said transistors connecting said resistive element to a ground in said second power domain, said at least one transistor having a gate normally bias to off.

22. The chip according to claim 21, wherein said resistive element comprises a pass gate having at least one n-channel type of said transistors in parallel with at least one p-channel type of said transistors.

23. The chip according to claim 19, wherein each of, said cells consist of an R-cell.

24. The chip according to claim 19, wherein each of said cells comprise a plurality of pads in said first metal layer connected to each node of said transistors.

* * * * *